(12) United States Patent
DellaGuardia et al.

(10) Patent No.: US 7,253,100 B2
(45) Date of Patent: Aug. 7, 2007

(54) REDUCING DAMAGE TO ULK DIELECTRIC DURING CROSS-LINKED POLYMER REMOVAL

(75) Inventors: Ronald A. DellaGuardia, Poughkeepsie, NY (US); Daniel C. Edelstein, White Plains, NY (US); Habib Hichri, Poughkeepsie, NY (US); Vincent J. McGahay, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 11/164,290

(22) Filed: Nov. 17, 2005

(65) Prior Publication Data

US 2007/0111466 A1    May 17, 2007

(51) Int. Cl.
*H10L 21/4763* (2006.01)
(52) U.S. Cl. .................. 438/637; 438/424; 438/622
(58) Field of Classification Search ................ 438/424, 438/622, 624, 637, 781, 782
See application file for complete search history.

(56) References Cited

U.S. PATENT DOCUMENTS

| | | | |
|---|---|---|---|
| 5,585,673 A | 12/1996 | Joshi et al. | |
| 5,695,810 A | 12/1997 | Dubin et al. | |
| 6,140,226 A | 10/2000 | Grill | |
| 6,303,505 B1 | 10/2001 | Ngo et al. | |
| 6,319,819 B1 | 11/2001 | Besser et al. | |
| 6,323,554 B1 | 11/2001 | Joshi et al. | |
| 6,329,118 B1 | 12/2001 | Hussein et al. | |
| 6,342,733 B1 | 1/2002 | Hu et al. | |
| 6,365,529 B1 | 4/2002 | Hussein et al. | |
| 6,383,925 B1 | 5/2002 | Ngo et al. | |
| 6,429,128 B1 | 8/2002 | Besser et al. | |
| 6,506,677 B1 | 1/2003 | Avanzino et al. | |
| 6,764,951 B1 | 7/2004 | van Ngo | |
| 6,797,652 B1 | 9/2004 | Ngo et al. | |
| 6,818,557 B1 | 11/2004 | Ngo et al. | |
| 2003/0134499 A1 | 7/2003 | Chen et al. | |
| 2004/0152278 A1* | 8/2004 | Farrar | 438/400 |
| 2004/0266201 A1 | 12/2004 | Wille et al. | |

OTHER PUBLICATIONS

Hussein, M. et al., "A Novel Approach to Dual Damascene Patterning," Intel Corporation, Portland Technology Development. 3 pages, 2002.
Goldblatt, R.D. et al., "A High Performance 0.13 μm Copper BEOL Technology with Low-k Dielectric," Proceedings of the IEEE 2000 International Interconnect Technology Conference, pp. 261-263, 2000.

* cited by examiner

*Primary Examiner*—Phuc T. Dang
(74) *Attorney, Agent, or Firm*—Lisa U. Jaklitsch; Hoffman, Warnick & D'Alessandro LLC

(57) ABSTRACT

Methods are disclosed for reducing damage to an ultra-low dielectric constant (ULK) dielectric during removal of a planarizing layer such as a crosslinked polymer. The methods at least partially fill an opening with an at most lightly crosslinked polymer, followed by the planarizing layer. When the at most lightly crosslinked polymer and planarizing layer are removed, the at most lightly crosslinked polymer removal is easier than removal of the planarizing layer, i.e., crosslinked polymer, and does not damage the surrounding dielectric compared to removal chemistries used for the crosslinked polymer.

20 Claims, 3 Drawing Sheets

REDUCING DAMAGE TO ULK DIELECTRIC DURING CROSS-LINKED POLYMER REMOVAL

BACKGROUND OF THE INVENTION

1. Technical Field

The present invention relates generally to semiconductor fabrication, and more particularly, to methods for reducing damage to an ultra low dielectric constant (ULK) dielectric during removal of a crosslinked polymer.

2. Related Art

During the semiconductor fabrication process, it is advantageous to use a crosslinked polymer as a planarizing layer to fill via openings for other processing. Subsequently, the crosslinked polymer must be removed. Unfortunately, crosslinked polymers are difficult to remove and require relatively longer stripping times or more aggressive plasma conditions. As a result, conventional removal procedures cause damage to a surrounding ultra low dielectric constant (ULK) dielectric. For example, damage may include residue(s) on the sidewalls of the ULK dielectric, conversion of the ULK dielectric to a more silicon dioxide-like material or removal of carbon.

FIGS. 1A-C show an illustrative conventional method for removing a crosslinked polymer. As shown in FIG. 1A, at a starting point of this stage, a structure 8 includes, for example, a metal 10 in a substrate 12, hardmask 14, cap layer 16, an ultra low dielectric constant (ULK) dielectric 18, a hydrogenated silicon oxycarbide (SICOH) hardmask layer 20 and a hard mask 22 (e.g., tetraethyl orthosilicate $Si(OC_2H_5)_4$ (TEOS)). Hard mask 22 would be used as a sacrificial process-assist layer for via reactive ion etch (RIE) and strip. Structure 8 would then have a crosslinked polymer 24 applied into the via opening and baked. Crosslinked polymer 24 has been found advantageous at this stage because it exhibits good image transfer to ULK dielectric 18. Next, a barrier layer 26 would be deposited, followed by line level lithography including, typically, use of an anti-reflective coating (ARC) 28 and a patterned photoresist 30. As shown in FIG. 1B, line level RIE would remove parts of ULK dielectric 18, leaving part of crosslinked polymer 24 in a bottom of the via opening. FIG. 1C shows the next step including a removal of the crosslinked polymer 24 (FIG. 1B) from the bottom of the via opening, which would be followed, typically, by a wet clean. FIG. 1C also shows the plasma-induced damage 32. The relatively longer duration or aggressive plasma condition required to remove the crosslinked polymer 24 from the bottom of the via opening adds to damage 32.

In view of the foregoing, there is a need in the art for a solution that reduces the damage to ULK dielectric during removal of crosslinked polymer.

SUMMARY OF THE INVENTION

Methods are disclosed for reducing damage to a ULK dielectric during removal of a planarizing layer, such as a crosslinked polymer. The methods at least partially fill an opening with an at most lightly crosslinked polymer, followed by the planarizing layer. When the at most lightly crosslinked polymer and planarizing layer are removed, the at most lightly crosslinked polymer removal is easier than removal of the planarizing layer, i.e., crosslinked polymer, and does not damage the surrounding dielectric compared to removal chemistries used for the crosslinked polymer.

A first aspect of the invention is directed to a method of forming an integrated circuit, the method comprising the steps of: forming an opening in a dielectric; at least partially filling the opening with an at most lightly crosslinked polymer; forming a crosslinked polymer over the at most lightly crosslinked polymer; performing other processing; removing the crosslinked polymer; and removing the at most lightly crosslinked polymer.

A second aspect of the invention includes a method of reducing damage to a dielectric during removal of a planarizing layer therefrom, the method comprising the steps of: at least partially filling an opening in the dielectric with an at most lightly crosslinked polymer prior to forming the planarizing layer; performing processing that includes removing at least a portion of the planarizing layer; and removing the at most lightly crosslinked polymer.

A third aspect of the invention relates to a method of forming an integrated circuit, the method comprising the steps of: forming an opening in a dielectric; at least partially filling the opening with an at most lightly crosslinked polymer; forming a crosslinked polymer over the at most lightly crosslinked polymer; depositing a barrier layer; forming a line opening and removing at least a portion of the crosslinked polymer; removing any remaining portion of the crosslinked polymer; removing the at most lightly crosslinked polymer; and forming a metal in at least one of the opening and the line opening.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAIL DESCRIPTION

Figure 2A:
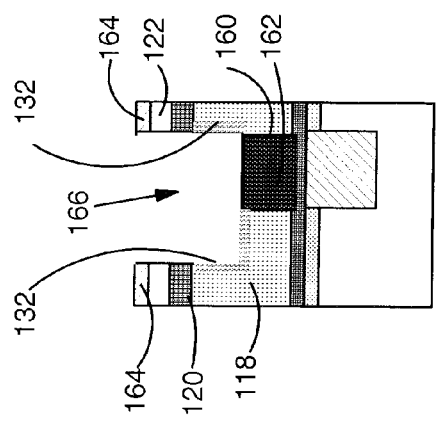
FIGS. 2A-2D show a method according to one embodiment of the invention for reducing damage to an opening in a dielectric during removal of a planarizing layer therefrom.

With reference to the accompanying drawings, FIGS. 2A-2D show methods for forming an integrated circuit and reducing damage to a dielectric during removal of a crosslinked polymer therefrom. FIG. 2A, as will be described, shows a number of steps combined for brevity. As shown in FIG. 2A, an introductory structure 108 includes, for example, a metal 110 in a substrate 112, a hardmask layer 114, a cap layer 116 and a dielectric 118. In one embodiment, dielectric 118 includes an ultra low dielectric constant (ULK) dielectric. The ULK dielectric may include any now known or later developed dielectric having a dielectric constant lower than 3.9, i.e., the dielectric constant of silicon dioxide ($SiO_2$). Structure 108 may further include a hydrogenated silicon oxycarbide (SICOH) hardmask layer 120 and a sacrificial hard mask 122 (e.g., tetraethyl orthosilicate $Si(OC_2H_5)_4$ (TEOS)). An initial step includes forming an opening 160, e.g., a via opening, in dielectric 118 by, for example, using a reactive ion etch (RIE), followed by a stripping step comprising a plasma containing oxygen ($O_2$), carbon monoxide (CO), carbon dioxide ($CO_2$), nitrogen ($N_2$), hydrogen ($H_2$), ammonia ($NH_3$), argon (Ar), helium (He) or other gases capable of removing organic layers, including combinations thereof.

Figure 3:
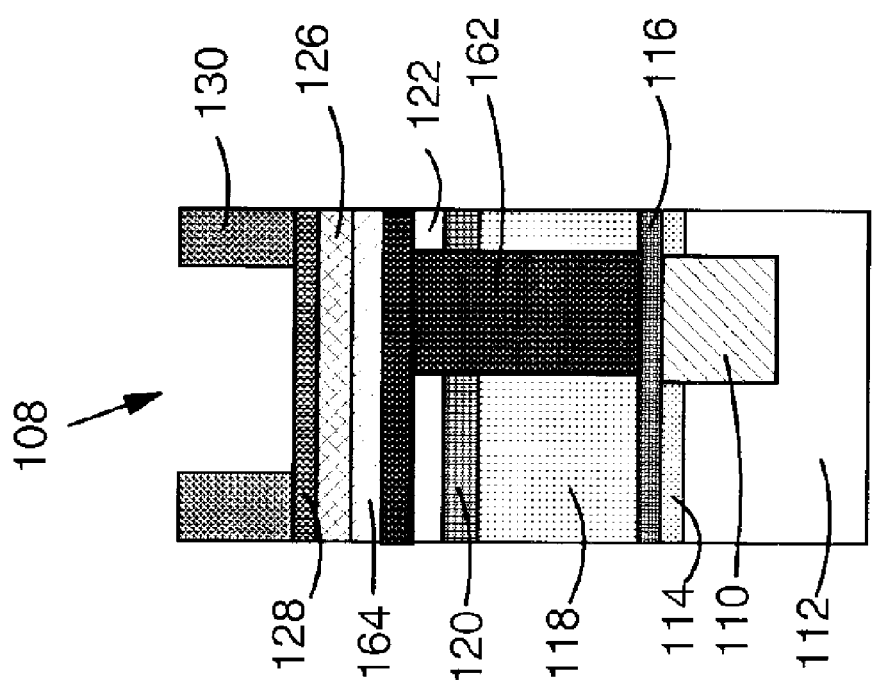
FIG. 3 shows an alternative embodiment of the invention including overfilling the opening with an at most lightly crosslinked polymer.

Next, in order to hide opening 160 during other processing, a bi-layer planarizing structure is formed according to one embodiment of the invention. In one embodiment, this step includes at least partially filling opening 160 with an at most lightly crosslinked polymer 162, and then forming a planarizing layer 164 over polymer 162. As shown in FIG. 2A, in one embodiment, polymer 162 fills only a portion of opening 160, and planarizing layer 164 fills at least any remaining portion of opening 160. In this case, the at most lightly crosslinked polymer 162 may simply be deposited in a portion of opening 160, or polymer 162 may fill the entire opening 160 and then an etching can be performed to remove polymer 162 except in a lower portion of opening 160. As shown in an alternative embodiment in FIG. 3, where the at most lightly crosslinked polymer 162 overfills opening 160, planarizing layer 164 is formed over the overfilled portion of polymer 162, i.e., the etching step may be omitted.

In one embodiment, at most lightly crosslinked polymer 162 may include an un-crosslinked polymer or a lightly crosslinked polymer. Preferably, an un-crosslinked polymer is used because it can be removed more readily. In one embodiment, an un-crosslinked polymer such as a cyclic olefin selected from the group consisting of: Norbornene-hexafluoro alcohol (Norbornene-HFA), Norbornene-sulfonomide and Poly-Norbornene Acetate, is used. However, it may be advantageous to use a lightly crosslinked polymer such as polymethyl methacrylate vinyl benzene cyclobutene (PMMA-VBCB) to prevent any potential dissolving of at most lightly crosslinked polymer 162 when planarizing layer 164 is subsequently formed with its own solvent, which may dissolve polymer 162.

In one embodiment, planarizing layer 164 includes a non-imageable crosslinked polymer. In one example, planarizing layer 164 may include a blended poly (hydroxystyrene)-based system, which has been found advantageous as a planarizing layer because it presents a planar surface that hides openings, e.g., vias, and exhibits good image transfer to ULK dielectric 118. In one embodiment, planarizing layer 164 includes a poly(hydroxystyrene)-based system comprising poly(4-hydroxystyrene), 9-anthracenyl-methylated poly(hydroxystyrene), tetrahydro-1,3,4,6-tetrakis(methoxymethyl)-imidazo[4,5-d]imidazole-2,5-(1H, 3H)-dione and a p-nitrobenzyl tosylate (pNBT).

Figures 1A, 1B, 1C:
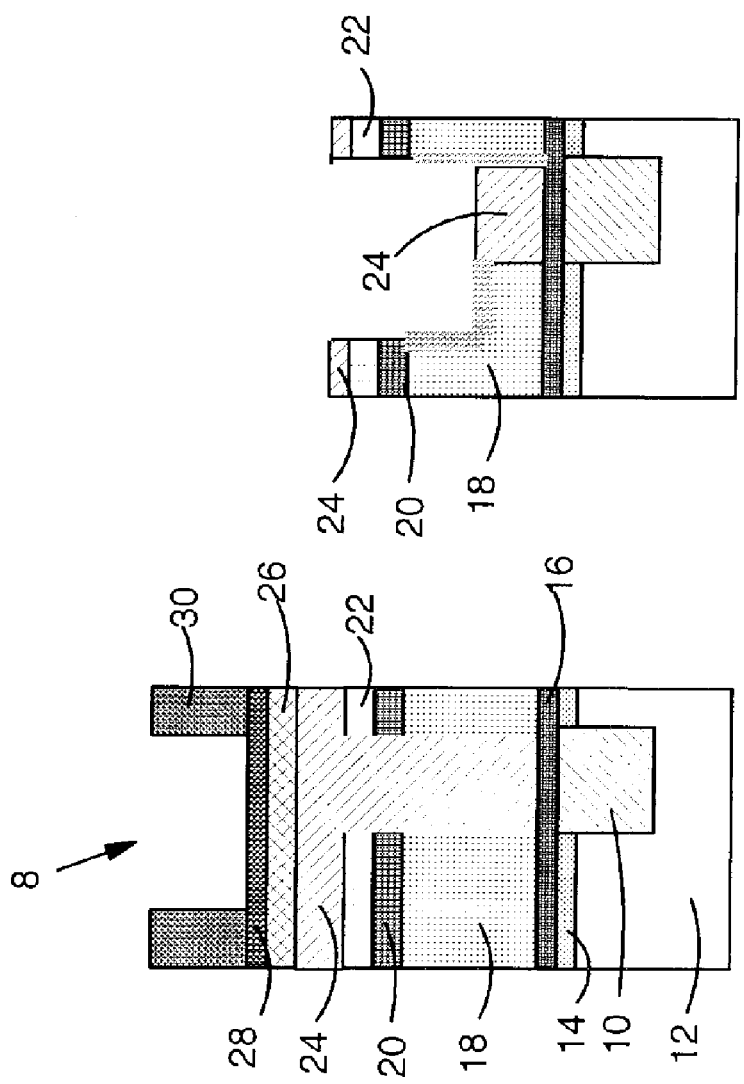
FIGS. 1A-C show an illustrative conventional method for removing a crosslinked polymer.
Figure 2B:
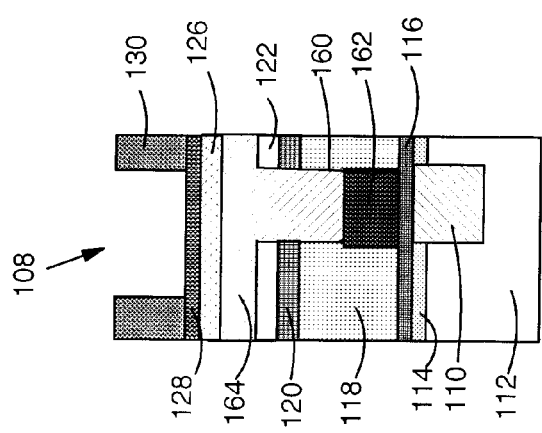

Referring to FIGS. 2A and 2B, the next step includes performing other processing, which may include removing at least a portion of planarizing layer 164. In one example, 'other processing' may include depositing a barrier layer 126, followed by forming a line opening 166 (FIG. 2B). Line opening 166 forming may include line level lithography including use of an anti-reflective coating (ARC) 128 (FIG. 1) and a patterned photoresist 130 (FIG. 1), followed by, as shown in FIG. 2B, a line level reactive ion etch (RIE) that transfers into ARC 128, barrier layer 126, planarizing layer 164 and hard mask 122 and eventually dielectric 118. Typically, a portion of planarizing layer 164 remains, as shown in FIG. 2B.

Figure 2C:
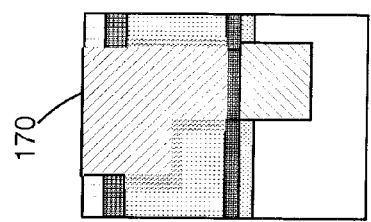

As shown in FIG. 2C, a next step includes removing (any remaining) planarizing layer 164 (FIG. 2B) using, for example, a plasma strip. As also shown in FIG. 2C, this step may also remove part of at most lightly crosslinked polymer 162. However, this is not necessary. As this step occurs, some damage 132 is caused to sidewalls of dielectric 118 in line opening 166 and opening 160. However, at most lightly crosslinked polymer 162 remains in a lower portion of opening 160 during this step, thus protecting the lower portion of opening 160 and reducing damage thereto.

Figure 2D:
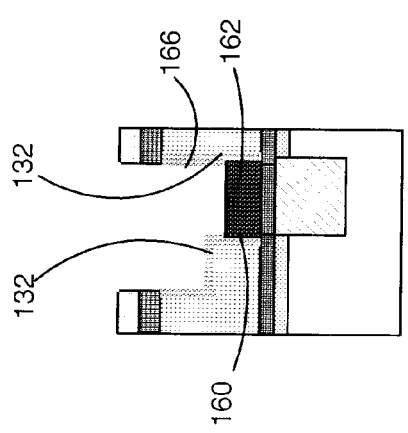

Next, as shown in FIG. 2D, at most lightly crosslinked polymer 162 is removed from the remaining, lower portion of opening 160 (shown filled with metal 170). Where the at most lightly crosslinked polymer 162 includes an un-crosslinked polymer, this step preferably includes performing a wet etch. In this case, the wet etch may use at least one of: gamma butyl lactone (GBL) and tetra methyl ammonium hydroxide (TMAH). Other strong organic solvents (such as GBL) or weak bases (such as TMAH) may be used also. Alternatively, this step may include performing a thermal decomposition at an appropriate temperature (e.g., 400° C. for PMMA-VBCB) to dissolve the particular polymer 162, i.e., when polymer 162 includes either an un-crosslinked polymer or a lightly crosslinked polymer.

Subsequent steps may include conventional processing such as wet cleaning of openings 160, 166, e.g., with a de-ionized water (DI) rinse, after removal of the at most lightly crosslinked polymer 162, and forming a metal 170 (FIG. 2D) in at least one of opening 160 (FIGS. 2A-2C) and line opening 166 (FIGS. 2B-2C). Conventional chemical mechanical polishing (CMP) may follow these steps.

Figure 4:
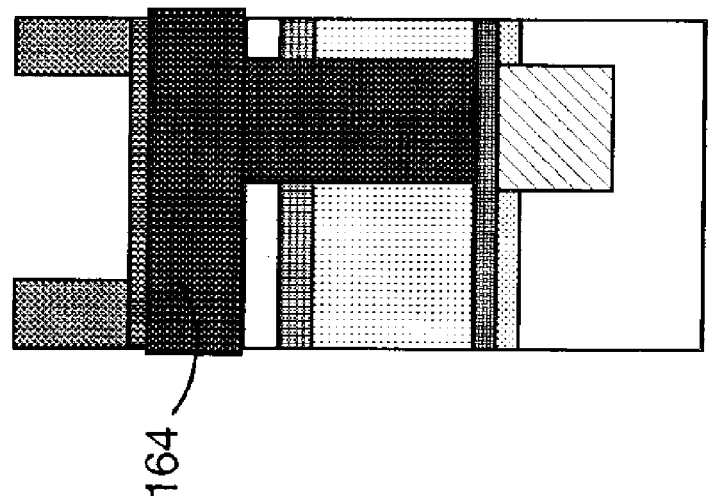
FIG. 4 shows an alternative embodiment of the invention applied to an integration scheme that does not use a barrier layer over the planarizing layer.

The above-described methods use barrier layer 126 to prevent poisoning of photoresist, etc. through diffusion to/from dielectric 118. As shown in FIG. 4, it should be recognized that the invention is also applicable to other applications such as those that use a sacrificial light absorbing material (SLAM) without a barrier layer. However, as those with skill in the art will understand, this alternative embodiment does not address the poisoning issues.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of forming an integrated circuit, the method comprising the steps of:
    forming an opening in a dielectric;
    at least partially filling the opening with an at most lightly crosslinked polymer;
    forming a crosslinked polymer over the at most lightly crosslinked polymer;
    performing other processing;
    removing the crosslinked polymer; and
    removing the at most lightly crosslinked polymer.

2. The method of claim 1, wherein the at most lightly crosslinked polymer includes one of: an un-crosslinked polymer and a lightly crosslinked polymer.

3. The method of claim 2, wherein the at most lightly crosslinked polymer removal step includes performing a wet etch in the case that the at most lightly crosslinked polymer includes the un-crosslinked polymer.

4. The method of claim 3, wherein the wet etch performing step includes using at least one of: gamma butyl lactone (GBL) and tetra methyl ammonium hydroxide (TMAH).

5. The method of claim 2, wherein the at most lightly crosslinked polymer removal step includes performing a thermal decomposition.

6. The method of claim 2, wherein the un-crosslinked polymer includes a cyclic olefin selected from the group consisting of: Norbornene-hexafluoro alcohol (Norbornene-HFA), Norbornene-sulfonomide and Poly-Norbornene Acetate.

7. The method of claim 2, wherein the lightly crosslinked polymer includes polymethyl methacrylate vinyl benzene cyclobutene (PMMA-VBCB).

8. The method of claim 1, wherein the at least partially filling step includes filling the opening with the at most lightly crosslinked polymer and etching to remove the at most lightly crosslinked polymer except in a lower portion of the opening.

9. The method of claim 1, wherein the performing other processing step includes:
 depositing a barrier layer; and
 forming a line opening including removing at least a portion of the crosslinked polymer.

10. The method of claim 1, wherein the at most lightly crosslinked polymer includes a poly(hydroxystyrene)-based system comprising poly(4-hydroxystyrene), 9-anthracenylmethylated poly(hydroxystyrene), tetrahydro-1,3,4,6-tetrakis(methoxymethyl)-imidazo[4,5-d]imidazole-2,5-(1H, 3H)-dione and a p-nitrobenzyl tosylate (pNBT).

11. A method of reducing damage to a dielectric during removal of a planarizing layer therefrom, the method comprising the steps of:
 at least partially filling an opening in the dielectric with an at most lightly crosslinked polymer prior to forming the planarizing layer;
 performing processing that includes removing at least a portion of the planarizing layer; and
 removing the at most lightly crosslinked polymer.

12. The method of claim 11, wherein the at most lightly crosslinked polymer includes one of: an un-crosslinked polymer and a lightly crosslinked polymer.

13. The method of claim 12, wherein the at most lightly crosslinked polymer removal step includes performing a wet etch in the case that the at most lightly crosslinked polymer includes the un-crosslinked polymer.

14. The method of claim 13, wherein the wet etch performing step includes using at least one of: gamma butyl lactone (GBL) and tetra methyl ammonium hydroxide (TMAH).

15. The method of claim 12, wherein the at most lightly crosslinked polymer removal step includes performing a thermal decomposition.

16. The method of claim 12, wherein the un-crosslinked polymer includes a cyclic olefin selected from the group consisting of: Norbornene-hexafluoro alcohol (Norbornene-HFA), Norbornene-sulfonomide and Poly-Norbornene Acetate.

17. The method of claim 12, wherein the lightly crosslinked polymer includes polymethyl metha-acrylate vinyl benzene cyclobutene.

18. The method of claim 11, wherein the planarizing layer includes a crosslinked polymer including a poly(hydroxystyrene)-based system comprising poly(4-hydroxystyrene), 9-anthracenylmethylated poly(hydroxystyrene), tetrahydro-1,3,4,6-tetrakis(methoxymethyl)-imidazo[4,5-d]imidazole-2,5-(1H,3H)-dione and a p-nitrobenzyl tosylate (pNBT).

19. A method of forming an integrated circuit, the method comprising the steps of:
 forming an opening in a dielectric;
 at least partially filling the opening with an at most lightly crosslinked polymer;
 forming a crosslinked polymer over the at most lightly crosslinked polymer;
 depositing a barrier layer;
 forming a line opening and removing at least a portion of the crosslinked polymer;
 removing any remaining portion of the crosslinked polymer;
 removing the at most lightly crosslinked polymer; and
 forming a metal in at least one of the opening and the line opening.

20. The method of claim 19, wherein the crosslinked polymer includes a non-imageable planarizing layer.

* * * * *